United States Patent

Van Engelen et al.

[11] Patent Number: 5,844,666
[45] Date of Patent: Dec. 1, 1998

[54] POSITIONING DEVICE WITH A VIBRATION-FREE OBJECT TABLE, AND LITHOGRAPHIC DEVICE PROVIDED WITH SUCH A POSITIONING DEVICE

[75] Inventors: Gerard Van Engelen, Eindhoven; Cornelis D. Van Dijk, Boxtel; Johannes M. M. Van Kimmenade, Eil; Jan Van Eijk, Eindhoven, all of Netherlands

[73] Assignee: U.S. Philips Corporation, New York, N.Y.

[21] Appl. No.: 642,014

[22] Filed: May 2, 1996

[30] Foreign Application Priority Data

May 30, 1995 [EP] European Pat. Off. .............. 95201409

[51] Int. Cl.⁶ .......................... G03B 27/58; G03B 27/42; G03B 27/62
[52] U.S. Cl. .................................. 355/72; 355/53; 355/75
[58] Field of Search .................................. 355/53, 67, 72, 355/75

[56] References Cited

U.S. PATENT DOCUMENTS

| 5,172,160 | 12/1992 | Van Eijk et al. | 355/53 |
| 5,187,519 | 2/1993 | Takabayashi et al. | 355/53 |
| 5,194,893 | 3/1993 | Nishi | 355/53 |
| 5,260,580 | 11/1993 | Itoh et al. | 250/492.2 |
| 5,359,389 | 10/1994 | Isohata | 355/53 |
| 5,446,519 | 8/1995 | Makinouchi | 355/53 |

FOREIGN PATENT DOCUMENTS

| 0421527A1 | 10/1991 | European Pat. Off. | B23Q 1/18 |
| 0498496A1 | 12/1992 | European Pat. Off. | G03F 7/20 |

*Primary Examiner*—R. L. Moses
*Assistant Examiner*—Shival Virmani

[57] ABSTRACT

A positioning device with a drive unit with which an object table is displaceable over a guide which is fastened to a first frame thereof. A stationary part of the drive unit is fastened to a second frame thereof and dynamically isolated from the first frame while a reaction force of the object table arising from a driving force exerted by the drive unit on the object table is transmittable exclusively into the second frame.

22 Claims, 9 Drawing Sheets

5,844,666

POSITIONING DEVICE WITH A VIBRATION-FREE OBJECT TABLE, AND LITHOGRAPHIC DEVICE PROVIDED WITH SUCH A POSITIONING DEVICE

BACKGROUND OF THE INVENTION

FIELD OF THE INVENTION

The invention relates to a positioning device with an object table and a drive unit by which the object table is displaceable over a guide parallel to at least an X-direction, which guide is fastened to a first frame of the positioning device while a stationary part of the drive unit is fastened to a second frame of the positioning device which is dynamically isolated from the first frame.

The invention further relates to a lithographic device with a machine frame which, seen parallel to a vertical Z-direction, supports in that order a radiation source, a mask holder, a focusing system with a main axis directed parallel to the Z-direction, and a substrate holder which is displaceable perpendicularly to the Z-direction by means of a positioning device.

The invention also relates to a lithographic device with a machine frame which, seen parallel to a vertical Z-direction, supports in that order a radiation source, a mask holder which is displaceable perpendicularly to the Z-direction by means of a positioning device, a focusing system with a main axis directed parallel to the Z-direction, and a substrate holder which is displaceable perpendicularly to the Z-direction by means of a further positioning device.

A positioning device of the kind mentioned in the opening paragraph is known from U.S. Pat. No. 5,260,580. The known positioning device comprises an object table which is supported by and guided over a stationary base which in its turn is supported by a first frame. The known positioning device comprises a drive unit for displacing the object table over the stationary base. The drive unit has a first linear motor of which a stationary part is supported by the stationary base and a second linear motor of which a stationary part is supported by a second frame. The second frame is dynamically isolated from the first frame, so that mechanical forces and vibrations present in the second frame cannot be transmitted to the first frame. The object table of the known positioning device is displaceable during operation by means of the second linear motor into a position which lies close to a desired end position, whereupon it can be moved into the desired end position by the first linear motor. The displacement of the object table by the second linear motor is usually a comparatively great, speed-controlled displacement during which the second linear motor exerts a comparatively great driving force on the object table. The subsequent displacement of the object table by the first linear motor is a comparatively small, position-controlled displacement during which the first linear motor exerts a comparatively small driving force on the object table. Since the stationary part of the second linear motor is supported by the second frame which is dynamically isolated from the first frame, it is prevented that a comparatively great reaction force exerted by the object table on the second linear motor and arising from the driving force exerted by the second linear motor on the object table, as well as mechanical vibrations caused by the reaction force in the second frame are transmitted into the first frame, the stationary base, and the object table. The fact that the stationary base and the object table of the known positioning device thus remain free from the comparatively strong mechanical vibrations caused by the second linear motor means that the object table is displaceable into the desired end position in a quick and accurate manner by means of the first linear motor.

A disadvantage of the known positioning device is that the stationary part of the first linear motor is supported by the stationary base over which the object table is guided. As a result, a reaction force exerted by the object table on the first linear motor and arising from the driving force exerted by the first linear motor on the object table is transmitted into the stationary base and the first frame. The displacement of the object table by means of the first linear motor is comparatively small, it is true, so that the value of said reaction force is comparatively low, but said reaction force has a comparatively high frequency. The frequency of said reaction force is comparable to a natural frequency which is characteristic of a usual frame, such as the first frame of the known positioning device, in particular if the displacement of the object table into the desired end position is to take place within a comparatively short time span. Under such circumstances the reaction force of the first linear motor will cause the first frame to resonate, whereby comparatively strong mechanical vibrations arise in the first frame, the stationary base, and the object table, which detract from the positioning accuracy of the first linear motor and lengthen the time required for reaching the desired end position.

SUMMARY OF THE INVENTION

It is an object of the invention to provide a positioning device of the kind mentioned in the opening paragraph with which the above disadvantage is prevented as much as possible.

The invention is for this purpose characterized in that a reaction force exerted by the object table on the drive unit during operation and arising from a driving force exerted by the drive unit on the object table is transmittable exclusively into the second frame. Since said reaction force can be transmitted exclusively into the second frame, mechanical vibrations are caused in the second frame only by the reaction force. Since the second frame is dynamically isolated from the first frame, the mechanical vibrations caused in the second frame by the reaction force are not transmitted into the first frame, so that the first frame, the guide, and the object table remain free from mechanical vibrations caused by said reaction force. It is prevented thereby that the first frame is brought into resonance by comparatively high-frequency components of said reaction force which arise when the object table is accurately brought into the desired end position by the drive unit. The fact that the first frame remains free from mechanical vibrations caused by the reaction force implies not only that the positioning accuracy and the time required for positioning are improved owing to the absence of mechanical vibrations in the first frame, but also that the required time is further reduced because comparatively high frequencies of the driving force are admissible during positioning of the object table into the desired end position.

A special embodiment of a positioning device according to the invention is characterized in that the object table is coupled to the stationary part of the drive unit exclusively by a Lorentz force of a magnet system and an electric coil system of the drive unit during operation. Since the object table is coupled to the stationary part of the drive unit exclusively by said Lorentz force, the object table is physically decoupled from the stationary part of the drive unit, i.e. there is no physical contact or physical coupling between the object table and the stationary part of the drive unit. In the present embodiment, said Lorentz force comprises the driving force exerted by the drive unit on the object table. Since the object table is physically decoupled from the stationary part of the drive unit, it is prevented that mechanical vibrations caused in the stationary part of the drive unit by the reaction force arising from the Lorentz force are transmitted via the drive unit to the object table and the first frame.

A further embodiment of a positioning device according to the invention is characterized in that the magnet system and the electric coil system belong to a first linear motor of the drive unit, which drive unit comprises a second linear motor with a stationary part fastened to the second frame and a movable part which is displaceable parallel to the X-direction over a guide of the stationary part, the magnet system of the first linear motor being fastened to the object table and the electric coil system of the first linear motor being fastened to the movable part of the second linear motor. In this further embodiment, the object table is displaceable into a position close to a desired end position over a comparatively great distance parallel to the X-direction by means of the second linear motor, the object table being held in a substantially constant position relative to the movable part of the second linear motor during this by means of a Lorentz force of the first linear motor suitable for this purpose. After this, the object table is displaceable by means of the first linear motor into the desired end position, the movable part of the second linear motor being in a constant position relative to the stationary part during this. Since the object table need be displaced over comparatively small distances only during its positioning into the end position by means of the first linear motor, the magnet system and the electric coil system of the first linear motor need have only comparatively small dimensions. A reaction force on the stationary part of the second linear motor arising from a driving force exerted by the second linear motor is directly transmitted into the second frame. A reaction force on the electric coil system of the first linear motor arising from a Lorentz force exerted by the first linear motor is transmitted into the second frame via the movable part, the guide, and the stationary part of the second linear motor.

A yet further embodiment of a positioning device according to the invention is characterized in that the drive unit comprises a third linear motor with a stationary part which is fastened to the movable part of the second linear motor, and with a movable part which is displaceable parallel to a Y-direction which is perpendicular to the X-direction over a guide of the stationary part of the third linear motor, the electric coil system of the first linear motor being fastened to the movable part of the third linear motor. In this embodiment of the positioning device, the object table is displaceable parallel to the X- and Y-directions, while the guide for the object table is, for example, a surface which extends parallel to the X-direction and the Y-direction. The object table can be displaced over comparatively great distances parallel to the X-direction and the Y-direction into a position close to a desired end position by means of the second and third linear motors, respectively, whereupon it can be positioned in the desired end position by means of the first linear motor. It can be achieved through a suitable design of the magnet system and electric coil system of the first linear motor that the object table is displaceable over comparatively small distances parallel to the X-direction and the Y-direction by means of the first linear motor. A reaction force on the stationary part of the second motor arising from a driving force exerted by the second linear motor is transmitted directly to the second frame, while a reaction force on the stationary part of the third motor arising from a driving force exerted by the third linear motor is transmitted to the second frame via the movable part, the guide, and the stationary part of the second linear motor. A reaction force on the electric coil system of the first linear motor arising from a Lorentz force exerted by the first linear motor is transmitted to the second frame via the movable parts, the guides, and the stationary parts of the third and second linear motors in that order.

A particular embodiment of a positioning device according to the invention is characterized in that the positioning device is provided with a force actuator system controlled by an electric control unit and exerting a compensation force on the first frame during operation, which compensation force has a mechanical moment about a reference point of the first frame having a value equal to a value of a mechanical moment of a force of gravity acting on the object table about said reference point and a direction which is opposed to a direction of the mechanical moment of said force of gravity. The object table rests on the guide of the first frame with a support force which is determined by the force of gravity acting on the object table. When the object table is displaced, a point of application of said support force on the guide is also displaced relative to the first frame. The use of said force actuator system prevents the first frame from vibrating or shaking as a result of comparatively great or quick displacements of the object table and said point of application relative to the first frame. The control unit controls the compensation force of the force actuator system as a function of the position of the object table relative to the first frame. Owing to said compensation force, the displaceable object table has a so-called virtual centre of gravity which has a constant position relative to the first frame. In this embodiment of the positioning device, therefore, the first frame is not only free from mechanical vibrations caused by reaction forces of the drive unit of the object table, but also remains free from mechanical vibrations caused by displacements of the actual centre of gravity of the object table relative to the first frame. The positioning accuracy of the positioning device and the time required for a displacement of the object table into a desired end position are further improved in this manner.

A further embodiment of a positioning device according to the invention is characterized in that the object table is displaceable parallel to a horizontal direction, while the force actuator system exerts the compensation force on the first frame parallel to a vertical direction. Since the force actuator system exerts the compensation force on the first frame parallel to the vertical direction, the force actuator system does not exert forces on the first frame in a drive direction of the object table, so that no additional measures are necessary for preventing mechanical vibrations in the first frame directed parallel to the drive direction in addition to the measures taken in relation to the reaction forces of the drive unit of the object table. Vertical vibrations of the first frame are prevented in that a value of the compensation force of the force actuator system is kept constant and in that exclusively the point of application of the compensation force on the first frame is displaced as a function of the position of the object table. The displacement of the point of application of the compensation force of the force actuator system is achieved, for example, through the use of a force actuator system with at least two separate force actuators wherein the compensation forces of the force actuators are individually controlled as a function of the position of the object table, a sum of the compensation forces of the separate force actuators being kept constant.

A still further embodiment of a positioning device according to the invention is characterized in that the object table is displaceable parallel to a horizontal X-direction and parallel to a horizontal Y-direction which is perpendiucular to the X-direction, triangle and each exerting a compensation force on the first frame parallel to the vertical direction. The use of the force actuator system with the three force actuators mutually arranged in a triangle not only prevents mechanical vibrations of the first frame arising from a displacement of the object table parallel to the X-direction, but also prevents mechanical vibrations of the first frame arising from a displacement of the object table parallel to the Y-direction. The sum of the compensation forces of the individual force actuators is kept constant continually during operation, so that no vertical vibrations of the first frame are caused. The triangular arrangement of the force actuators in addition provides a particularly stable operation of the force actuator system.

A special embodiment of a positioning device according to the invention is characterized in that the force actuator system is integrated with a system of dynamic isolators by means of which the first frame is coupled to a base of the positioning device. The dynamic isolators are, for example, dampers with a comparatively low mechanical stiffness by means of which the first frame is dynamically isolated from said base. Owing to the comparatively low mechanical stiffness of the dampers, mechanical vibrations present in the base such as, for example, floor vibrations or vibrations of the second frame if the latter is fastened, for example, on the base, are not transmitted into the first frame. The integration of the force actuator system with the system of dynamic isolators provides a particularly compact and simple construction of the positioning device.

A further embodiment of a positioning device according to the invention is characterized in that the compensation force comprises exclusively a Lorentz force of a magnet system and an electric coil system of the force actuator system. The force actuator system comprises a part which is fastened to the first frame and a part which is fastened to a base of the positioning device. Since the compensation force of the force actuator system comprises exclusively a Lorentz force, said parts of the force actuator system are physically decoupled, i.e. there is no physical contact or physical coupling between said parts. It is prevented thereby that mechanical vibrations present in the base of the positioning device such as, for example, floor vibrations or vibrations of the second frame, if the latter is fastened, for example, on the base, are transmitted into the first frame and the object table via the force actuator system.

A lithographic device with a displaceable substrate holder of the kind mentioned in the opening paragraphs is known from EP-A-0 498 496. The known lithographic device is used in the manufacture of integrated semiconductor circuits by means of an optical lithographic process. The radiation source of the known lithographic device is a light source, while the focusing system is an optical lens system by means of which a partial pattern of an integrated semiconductor circuit, which pattern is present on a mask which can be placed on the mask holder of the lithographic device, is imaged on a reduced scale on a semiconductor substrate which can be placed on the substrate holder of the lithographic device. Such a semiconductor substrate comprises a large number of fields on which identical semiconductor circuits are provided. The individual fields of the semiconductor substrate are consecutively exposed for this purpose, the semiconductor substrate being in a constant position relative to the mask and the focusing system during the exposure of an individual field, while between two consecutive exposure steps a next field of the semiconductor substrate is brought into position relative to the focusing system by means of the positioning device of the substrate holder. This process is repeated a number of times, each time with a different mask with a different partial pattern, so that integrated semiconductor circuits of comparatively complicated structure can be manufactured. The structures of such integrated semiconductor circuits have detail dimensions which lie in the sub-micron range. The partial patterns present on the consecutive masks should accordingly be imaged on said fields of the semiconductor substrate with an accuracy relative to one another which lies in the sub-micron range. The semiconductor substrate should accordingly be positioned relative to the mask and the focusing system by means of the positioning device of the substrate holder with an accuracy also in the sub-micron range. To reduce the time required for the manufacture of the semiconductor circuits, moreover, the semiconductor substrate should be displaced with a comparatively high speed between two consecutive exposure steps and should be positioned relative to the mask and the focusing system with the desired accuracy.

According to the invention, the lithographic device with the displaceable substrate holder is characterized in that the positioning device of the substrate holder is a positioning device according to the invention, wherein the first frame of the positioning device of the substrate holder belongs to the machine frame of the lithographic device, while the second frame of the positioning device of the substrate holder belongs to a force frame of the lithographic device which is dynamically isolated from the machine frame. Comparatively great reaction forces exerted by the substrate holder on the positioning device during comparatively quick displacements between two exposure steps are thus transmitted to the force frame of the lithographic device, so that the machine frame of the lithographic device, which supports the mask holder, the focusing system and the substrate holder, remains free from mechanical vibrations caused by said reaction forces in the force frame. The accuracy with which the substrate holder can be positioned relative to the mask holder and the focusing system, and the time required for positioning the substrate holder with the desired accuracy are thus not adversely affected by said mechanical vibrations.

A lithographic device with a displaceable substrate holder and a displaceable mask holder of the kind mentioned in the opening paragraphs is known from U.S. Pat. No. 5,194,893. In this known lithographic device, the semiconductor substrate under manufacture is not in a constant position relative to the mask and the focusing system during the exposure of a single field of the semiconductor substrate, but instead the semiconductor substrate and the mask are synchronously displaced relative to the focusing system parallel to an X-direction which is perpendicular to the Z-direction by means of the positioning device of the substrate holder and the positioning device of the mask holder, respectively, during exposure. In this manner the pattern present on the mask is scanned parallel to the X-direction and synchronously imaged on the semiconductor substrate. It is achieved thereby that a maximum surface area of the mask which can be imaged on the semiconductor substrate by means of the focusing system is limited to a lesser degree by a size of an aperture of the focusing system. Since the detail dimensions of the integrated semiconductor circuits to be manufactured lie in the sub-micron range, the semiconductor substrate and the mask should be displaced with an accuracy also in the sub-micron range relative to the focusing system during the exposure. To reduce the time required for the manufacture of the semiconductor circuits, the semiconductor substrate and the mask should in addition be displaced and positioned relative to one another with a comparatively high speed during exposure. Since the pattern present on the mask is imaged on a reduced scale on the semiconductor substrate, the speed with which and the distance over which the mask is displaced are greater than the speed with which and the distance over which the semiconductor substrate is displaced, the ratio between said speeds and the ratio between said distances both being equal to a reduction factor of the focusing system.

According to the invention, the lithographic device with the displaceable substrate holder and displaceable mask holder is characterized in that the positioning device of the mask holder is a positioning device according to the invention, wherein the first frame of the positioning device of the mask holder belongs to the machine frame of the lithographic device, while the second frame of the positioning device of the mask holder belongs to a force frame of the lithographic device which is dynamically isolated from the machine frame.

A special embodiment of a lithographic device with a displaceable substrate holder according to the invention is characterized in that the mask holder is displaceable perpendicularly to the Z-direction by means of a positioning device according to the invention, wherein the first frame of the positioning device of the mask holder belongs to the machine frame of the lithographic device, while the second frame of the positioning device of the mask holder belongs to the force frame of the lithographic device.

Comparatively great reaction forces exerted on the positioning device of the mask holder by the mask holder as a result of the comparatively high speeds and accelerations of the mask holder during the exposure of the semiconductor substrate are thus transmitted to the force frame of the lithographic device. The lithographic device's machine frame, which supports the mask holder, the focusing system, and the substrate holder, thus remains free from mechanical vibrations caused by said reaction forces in the force frame. The accuracy with which the substrate holder and the mask holder are displaceable relative to the focusing system during the exposure of the semiconductor substrate is accordingly not adversely affected by said mechanical vibrations.

A further embodiment of a lithographic device according to the invention is characterized in that the positioning devices of the substrate holder and the mask holder have a joint force actuator system which is controlled by an electric control unit and which exerts a compensation force on the machine frame of the lithographic device during operation which has a mechanical moment about a reference point of the machine frame of a value which is equal to a value of a sum of a mechanical moment of a force of gravity acting on the substrate holder about said reference point and a mechanical moment of a force of gravity acting on the mask holder about said reference point, and a direction which is opposed to a direction of said sum of mechanical moments. The use of the joint force actuator system prevents the machine frame of the lithographic device from vibrating or shaking as a result of the comparatively quick displacements of both the mask holder and the substrate holder relative to the machine frame during the exposure of the semiconductor substrate. The control unit controls the compensation force of the joint force actuator system as a function of the position of the mask holder and the position of the substrate holder relative to the machine frame. It is prevented thereby that the accuracy with which the mask holder and the substrate holder can be positioned relative to the focusing system during the exposure of the semiconductor substrate is adversely affected by mechanical vibrations caused by displacements of the centres of gravity of the mask holder and the substrate holder relative to the machine frame.

A yet further embodiment of a lithographic device according to the invention is characterized in that the machine frame is placed on a base of the lithographic device, on which also the force frame is placed, by means of three dynamic isolators mutually arranged in a triangle, while the joint force actuator system comprises three separate force actuators which are each integrated with a corresponding one of the dynamic isolators. The dynamic isolators are, for example, dampers with a comparatively low mechanical stiffness by means of which the machine frame is dynamically isolated from said base. Owing to the comparatively low mechanical stiffness of the dampers, mechanical vibrations present in the base such as, for example, mechanical vibrations in the force frame caused by reaction forces of the positioning devices of the mask holder and the substrate holder are not transmitted to the machine frame. The integration of the force actuator system with the system of dynamic isolators provides a particularly compact and simple construction of the lithographic device. The triangular arrangement of the isolators in addition provides a particularly stable support for the machine frame.

BRIEF DESCRIPTION OF THE DRAWINGS

The invention will be explained in more detail below with reference to the drawings, in which.

DETAILED DESCRIPTION OF THE PREFERRED

Figure 1:
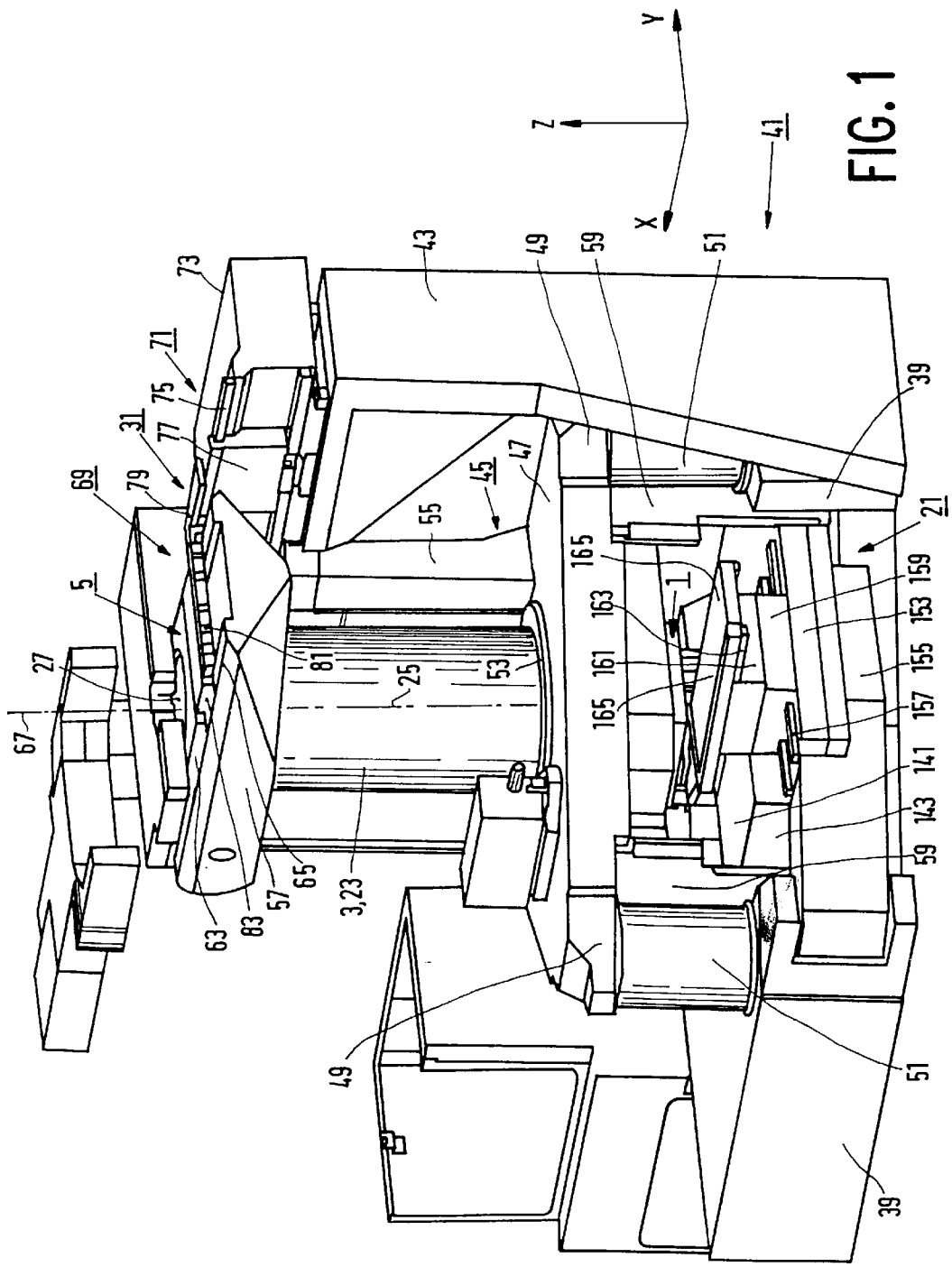
FIG. 1 shows a lithographic device according to the invention.
Figure 2:
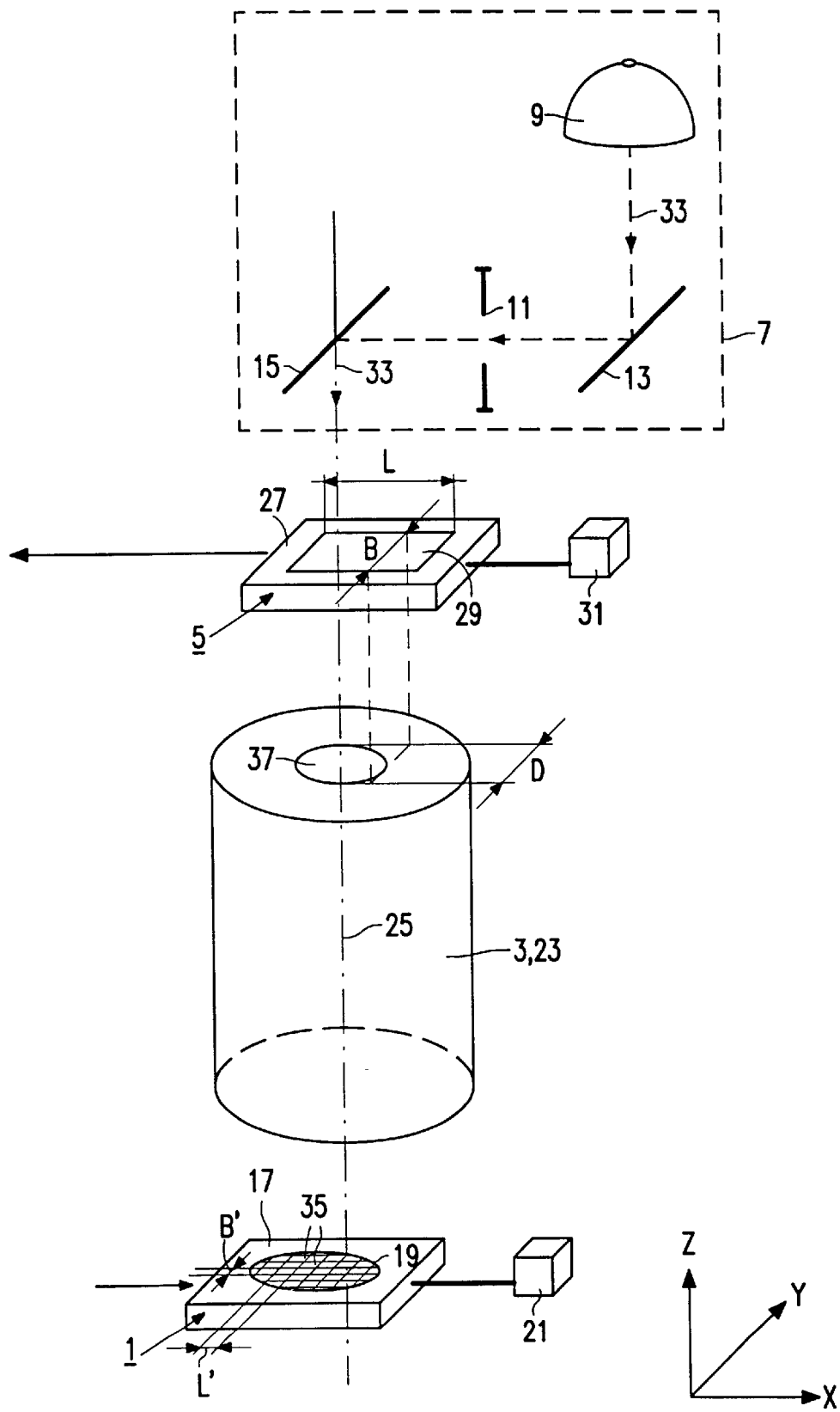
FIG. 2 is a diagram of the lithographic device of FIG. 1.

The lithographic device according to the invention shown in FIGS. 1 and 2 is used for the manufacture of integrated semiconductor circuits by an optical lithographic process. As FIG. 2 shows diagrammatically, the lithographic device is consecutively provided, seen parallel to a vertical Z-direction, with a substrate holder 1, a focusing system 3, a mask holder 5, and a radiation source 7. The lithographic device shown in FIGS. 1 and 2 is an optical lithographic device in which the radiation source 7 comprises a light source 9, a diaphragm 11, and mirrors 13 and 15. The substrate holder 1 comprises a support surface 17 which extends perpendicularly to the Z-direction and on which a semiconductor substrate 19 can be placed, while it is displaceable relative to the focusing system 3 parallel to an X-direction perpendicular to the Z-direction and parallel to a Y-direction which is perpendicular to the X-direction and the Z-direction by means of a first positioning device 21 of the lithographic device. The focusing system 3 is an imaging or projection system and comprises a system of optical lenses 23 with an optical main axis 25 which is parallel to the Z-direction and an optical reduction factor which is, for example, 4 or 5. The mask holder 5 comprises a support surface 27 which is perpendicular to the Z-direction and on which a mask 29 can be placed, while it is displaceable parallel to the X-direction relative to the focusing system 3 by means of a second positioning device 31 of the lithographic device. The mask 29 comprises a pattern or partial pattern of an integrated semiconductor circuit. During operation, a light beam 33 originating from the light source 9 is passed through the mask 29 via the diaphragm 11 and the mirrors 13, 15 and is focused on the semiconductor substrate 19 by means of the lens system 23, so that the pattern present on the mask 29 is imaged on a reduced scale on the semiconductor substrate 19. The semiconductor substrate 19 comprises a large number of individual fields 35 on which identical semiconductor circuits are provided. For this purpose, the fields 35 of the semiconductor substrate 19 are consecutively exposed through the mask 29, a next field 35 being positioned relative to the focusing system 3 each time after the exposure of an individual field 35 in that the substrate holder 1 is moved parallel to the X-direction or the Y-direction by means of the first positioning device 21. This process is repeated a number of times, each time with a different mask, so that comparatively complicated integrated semiconductor circuits with a layered structure are manufactured.

As FIG. 2 shows, the semiconductor substrate 19 and the mask 29 are synchronously displaced relative to the focusing system 3 parallel to the X-direction by the first and the second positioning device 21, 31 during the exposure of an individual field 35. The pattern present on the mask 29 is thus scanned parallel to the X-direction and synchronously imaged on the semiconductor substrate 19. In this way, as is clarified in FIG. 2, exclusively a maximum width B of the mask 29 directed parallel to the Y-direction which can be imaged on the semiconductor substrate 19 by the focusing system 3 is limited by a diameter D of an aperture 37 of the focusing system 3 diagrammatically depicted in FIG. 2. An admissible length L of the mask 29 which can be imaged on the semiconductor substrate 19 by the focusing system 3 is greater than said diameter D. In this imaging method, which follows the so-called "step and scan" principle, a maximum surface area of the mask 29 which can be imaged on the semiconductor substrate 19 by the focusing system 3 is limited by the diameter D of the aperture 37 of the focusing system 3 to a lesser degree than in a conventional imaging method which follows the so-called "step and repeat" principle, which is used, for example, in a lithographic device known from EP-A-0 498 496, where the mask and the semiconductor substrate are in fixed positions relative to the focusing system during exposure of the semiconductor substrate. Since the pattern present on the mask 29 is imaged on a reduced scale on the semiconductor substrate 19, said length L and width B of the mask 29 are greater than a corresponding length L' and width B' of the fields 35 on the semiconductor substrate 19, a ratio between the lengths L and L' and between the widths B and B' being equal to the optical reduction factor of the focusing system 3. As a result also, a ratio between a distance over which the mask 29 is displaced during exposure and a distance over which the semiconductor substrate 19 is displaced during exposure, and a ratio between a speed with which the mask 29 is displaced during exposure and a speed with which the semiconductor substrate 19 is displaced during exposure are both equal to the optical reduction factor of the focusing system 3. In the lithographic device shown in FIG. 2, the directions in which the semiconductor substrate 19 and the mask 29 are displaced during exposure are mutually opposed. It is noted that said directions may also be the same if the lithographic device comprises a different focusing system by which the mask pattern is not imaged in reverse.

The integrated semiconductor circuits to be manufactured with the lithographic device have a structure with detail dimensions in the sub-micron range. Since the semiconductor substrate 19 is exposed consecutively through a number of different masks, the patterns present on the masks must be imaged on the semiconductor substrate 19 relative to one another with an accuracy which is also in the sub-micron range, or even in the nanometer range. During exposure of the semiconductor substrate 19, the semiconductor substrate 19 and the mask 29 should accordingly be displaced relative to the focusing system 3 with such an accuracy, so that comparatively high requirements are imposed on the positioning accuracy of the first and the second positioning device 21, 31.

As FIG. 1 shows, the lithographic device has a base 39 which can be placed on a horizontal floor surface. The base 39 forms part of a force frame 41 to which further a vertical, comparatively stiff metal column 43 belongs which is fastened to the base 39. The lithographic device further comprises a machine frame 45 with a triangular, comparatively stiff metal main plate 47 which extends transversely to the optical main axis 25 of the focusing system 3 and is provided with a central light passage opening not visible in FIG. 1. The main plate 47 has three corner portions 49 with which it rests on three dynamic isolators 51 which are fastened on the base 49 and which will be described further below. Only two corner portions 49 of the main plate 47 and two dynamic isolators 51 are visible in FIG. 1, while all three dynamic isolators 51 are visible in FIGS. 3 and 4. The focusing system 3 is provided near a lower side with a mounting ring 53 by means of which the focusing system 3 is fastened to the main plate 47. The machine frame 45 also comprises a vertical, comparatively stiff metal column 55 fastened on the main plate 47. Near an upper side of the focusing system 3 there is furthermore a support member 57 for the mask holder 5, which member also belongs to the machine frame 45, is fastened to the column 55 of the machine frame 45, and will be explained further below. Also belonging to the machine frame 45 are three vertical suspension plates 59 fastened to a lower side of the main plate 47 adjacent the three respective corner portions 49. Only two suspension plates 59 are partly visible in FIG. 1, while all three suspension plates 59 are visible in FIGS. 3 and 4. As FIG. 4 shows, a horizontal support plate 61 for the substrate holder 1 also belonging to the machine frame 45 is fastened to the three suspension plates 59. The support plate 61 is not visible in FIG. 1 and only partly visible in FIG. 3.

It is apparent from the above that the machine frame 45 supports the main components of the lithographic device, i.e. the substrate holder 1, the focusing system 3, and the mask holder 5 parallel to the vertical Z-direction. As will be further explained below, the dynamic isolators 51 have a comparatively low mechanical stiffness. It is achieved thereby that mechanical vibrations present in the base 39 such as, for example, floor vibrations are not transmitted into the machine frame 45 via the dynamic isolators 51. The positioning devices 21, 31 as a result have a positioning accuracy which is not adversely affected by the mechanical vibrations present in the base 39. The function of the force frame 41 will be explained in more detail further below.

Figure 5:
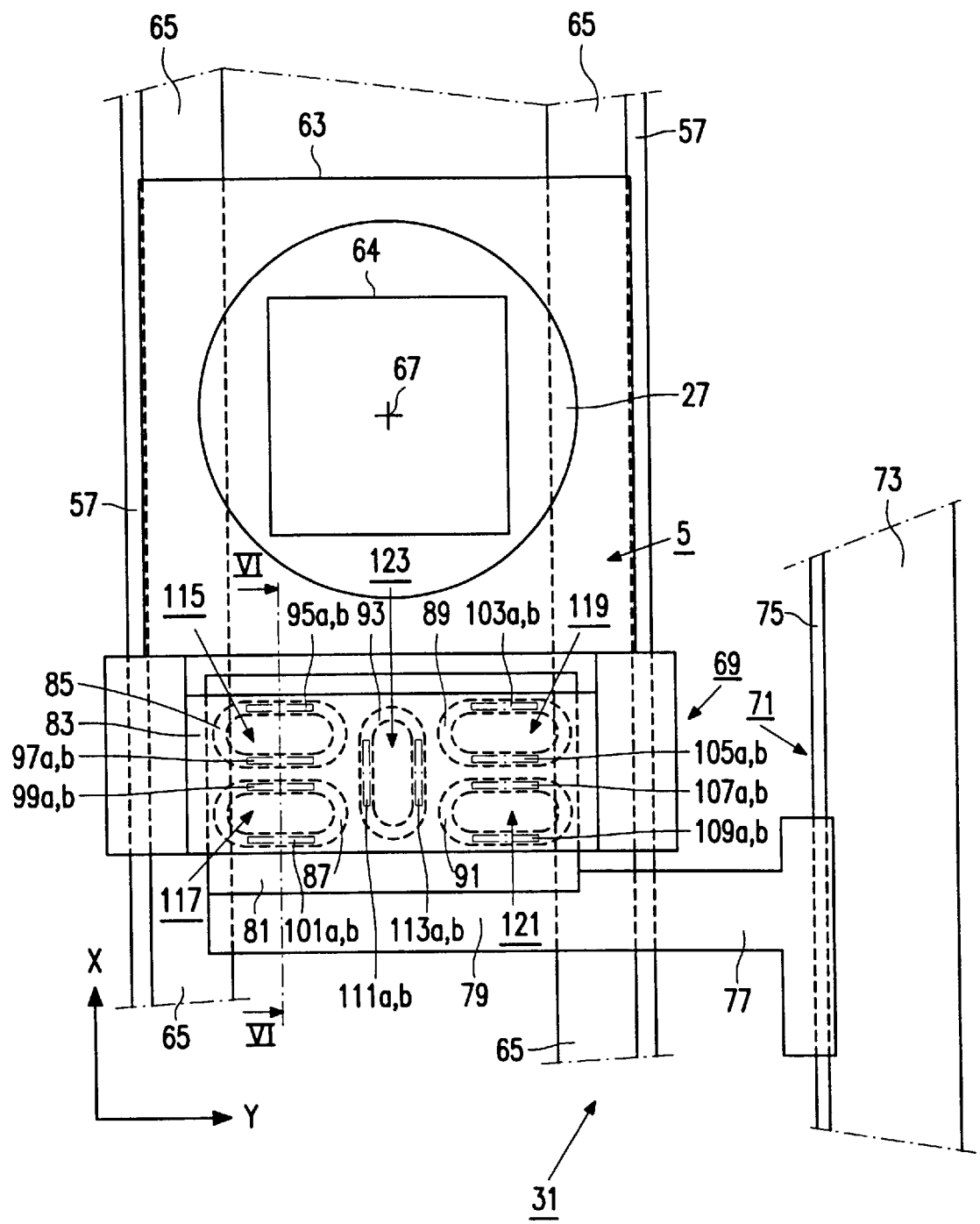
FIG. 5 is a plan view of a mask holder of the lithographic device of FIG. 1.

As FIGS. 1 and 5 show, the mask holder 5 comprises a block 63 on which said support surface 27 is present. The support member 57 for the mask holder 5 belonging to the machine frame 45 comprises a central light passage opening 64 visible in FIG. 5 and two plane guides 65 which extend parallel to the X-direction and which lie in a common plane which is perpendicular to the Z-direction. The block 63 of the mask holder S is guided over the plane guides 65 of the support member 57 by means of an aerostatic bearing (not visible in the Figures) with freedoms of movement parallel to the X-direction and parallel to the Y-direction, and a freedom of rotation about an axis of rotation 67 of the mask holder 5 which is directed parallel to the Z-direction.

Figure 6:
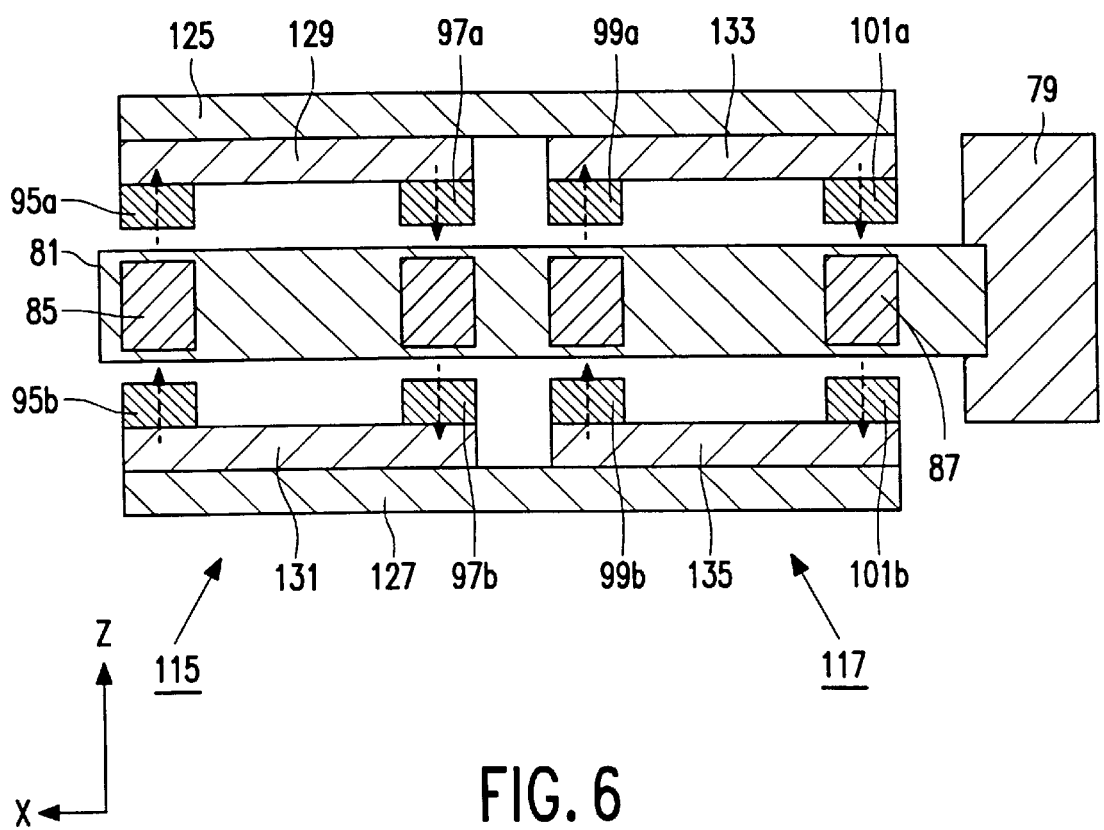
FIG. 6 is a cross-section taken on the line VI—VI in FIG. 5.

As FIGS. 1 and 5 further show, the second positioning device 31 by which the mask holder 5 is displaceable comprises a first linear motor 69 and a second linear motor 71. The second linear motor 71, which is of a kind usual and known per se, comprises a stationary part 73 which is fastened to the column 43 of the force frame 41. The stationary part 73 comprises a guide 75 which extends parallel to the X-direction and along which a movable part 77 of the second linear motor 71 is displaceable. The movable part 77 comprises a connection arm 79 which extends parallel to the Y-direction and to which an electric coil holder 81 of the first linear motor 69 is fastened. A permanent-magnet holder 83 of the first linear motor 69 is fastened to the block 63 of the mask holder 5. The first linear motor 69 is of a kind known from EP-B-0 421 527. As FIG. 5 shows, the coil holder 81 of the first linear motor 69 comprises four electric coils 85, 87, 89, 91 which extend parallel to the Y-direction, and an electric coil 93 which extends parallel to the X-direction. The coils 85, 87, 89, 91, 93 are diagrammatically indicated with broken lines in FIG. 5. The magnet holder 83 comprises ten pairs of permanent magnets (95a, 95b), (97a, 97b), (99a, 99b), (101a, 101b), (103a, 103b), (105a, 105b), (107a, 107b), (109a, 109b), (111a, 111b), (113a, 113b), indicated with dash-dot lines in FIG. 5. The electric coil 85 and the permanent magnets 95a, 95b, 97a and 97b belong to a first X-motor 115 of the first linear motor 69, while the coil 87 and the magnets 99a, 99b, 101a and 101b belong to a second X-motor 117 of the first linear motor 69, the coil 89 and the magnets 103a, 103b, 105a and 105b belong to a third X-motor 119 of the first linear motor 69, the coil 91 and the magnets 107a, 107b, 109a and 109b belong to a fourth X-motor 121 of the first linear motor 69, and the coil 93 and the magnets 111a, 111b, 113a and 113b belong to a Y-motor 123 of the first linear motor 69. FIG. 6 is a cross-sectional view of the first X-motor 115 and the second X-motor 117. As FIG. 6 shows, the coil holder 81 is arranged between a first part 125 of the magnet holder 83 which comprises the magnets 95a, 97a, 99a, 101a, 103a, 105a, 107a, 109a, 111a and 113a, and a second part 127 of the magnet holder which comprises the magnets 95b, 97b, 99b, 101b, 103b, 105b, 107b, 109b, 111b and 113b. As FIG. 6 further shows, the magnet pair 95a, 95b of the first X-motor 115 and the magnet pair 99a, 99b of the second X-motor 117 are magnetized parallel to a positive Z-direction, while the magnet pair 97a, 97b of the first X-motor 115 and the magnet pair 101a, 101b of the second X-motor 117 are magnetized parallel to an opposed, negative Z-direction. Thus also the magnet pair 103a, 103b of the third X-motor 119, the magnet pair 107a, 107b of the fourth X-motor 121, and the magnet pair 111a, 111b of the Y-motor 123 are magnetized parallel to the positive Z-direction, whereas the magnet pair 105a, 105b of the third X-motor 119, the magnet pair 109a, 109b of the fourth X-motor 121, and the magnet pair 113a, 113b of the Y-motor 123 are magnetized parallel to the negative Z-direction. As FIG. 6 further shows, the magnets 95a and 97a of the first X-motor 115 are interconnected by a magnetic closing yoke 129, while the magnets 95b and 97b, the magnets 99a and 101a, and the magnets 99b and 101b are interconnected by means of a magnetic closing yoke 131, a magnetic closing yoke 133, and a magnetic closing yoke 135, respectively. The third X-motor 119, the fourth X-motor 121, and the Y-motor 123 are provided with similar magnetic closing yokes. When during operation an electric current flows through the coils 85, 87, 89, 91 of the X-motors 115, 117, 119, 121, the magnets and coils of the X-motors 115, 117, 119, 121 mutually exert a Lorentz force directed parallel to the X-direction. If the electric currents through the coils 85, 87, 89, 91 are of equal value and direction, the mask holder 5 is displaced parallel to the X-direction by said Lorentz force, whereas the mask holder 5 is rotated about the axis of rotation 67 if the electric currents through the coils 85, 87 are of equal value as, but have a direction opposed to the electric currents through the coils 89, 91. The magnets and the coil of the Y-motor 123 mutually exert a Lorentz force directed parallel to the Y-direction as a result of an electric current through the coil 93 of the Y-motor 123, whereby the mask holder is displaced parallel to the Y-direction.

During exposure of the semiconductor substrate 19, the mask holder 5 should be displaced relative to the focusing system 3 parallel to the X-direction over a comparatively great distance and with a high positioning accuracy. To achieve this, the coil holder 81 of the first linear motor 69 is displaced parallel to the X-direction by means of the second linear motor 71, a desired displacement of the mask holder 5 being approximately achieved by the second linear motor 71, and the mask holder 5 being carried along relative to the movable part 77 of the second linear motor 71 by a suitable Lorentz force of the X-motors 115, 117, 119, 121 of the first linear motor 69. Said desired displacement of the mask holder 5 relative to the focusing system 3 is achieved in that the Lorentz force of the X-motors 115, 117, 119, 121 is controlled by means of a suitable position control system during the displacement of the mask holder 5. The position control system, which is not shown in any detail in the Figures, comprises, for example, a laser interferometer which is usual and known per se for measuring the position of the mask holder 5 relative to the focusing system 3, whereby the desired positioning accuracy in the sub-micron or nanometer range is achieved. During the exposure of the semiconductor substrate 19, the first linear motor 69 not only controls the displacement of the mask holder 5 parallel to the X-direction, but it also controls a position of the mask holder 5 parallel to the Y-direction and an angle of rotation of the mask holder 5 about the axis of rotation 67. Since the mask holder 5 can also be positioned parallel to the Y-direction and rotated about the axis of rotation 67 by the first linear motor 69, the displacement of the mask holder 5 has a parallelism relative to the X-direction which is determined by the positioning accuracy of the first linear motor 69. Deviations from parallelism of the guide 75 of the second linear motor 71 relative to the X-direction can thus be compensated through displacements of the mask holder 5 parallel to the Y-direction. Since the desired displacement of the mask holder 5 need be achieved approximately only by the second linear motor 71, and no particularly high requirements are imposed on the parallelism of the guide 75 relative to the X-direction, a comparatively simple, conventional, one-dimensional linear motor can be used as the second linear motor 71, by means of which the mask holder 5 is displaceable over comparatively large distances with a comparatively low accuracy. The desired accuracy of the displacement of the mask holder 5 is achieved in that the mask holder 5 is displaced over comparatively small distances relative to the movable part 77 of the second linear motor 71 by means of the first linear motor 69. The first linear motor 69 is of comparatively small dimensions because the distances over which the mask holder 5 is displaced relative to the movable part 77 of the second linear motor 71 are only small. Electrical resistance losses in the electric coils of the first linear motor 69 are minimized thereby.

As was noted above, the stationary part 73 of the second linear motor 71 is fastened to the force frame 41 of the lithographic device. It is achieved thereby that a reaction force exerted by the movable part 77 of the second linear motor 71 on the stationary part 73 and arising from a driving force of the second linear motor 71 exerted on the movable part 77 is transmitted into the force frame 41. Since furthermore the coil holder 81 of the first linear motor 69 is fastened to the movable part 77 of the second linear motor 71, a reaction force exerted by the mask holder 5 on the movable part 77 and arising from a Lorentz force of the first linear motor 69 exerted on the mask holder 5 is also transmitted into the force frame 41 via the movable part 77 and the stationary part 73 of the second linear motor 71. A reaction force exerted during operation by the mask holder 5 on the second positioning device 31 and arising from a driving force exerted on the mask holder 5 by the second positioning device 31 is thus introduced exclusively into the force frame 41. Said reaction force has a low-frequency component resulting from the comparatively great displacements of the second linear motor 71 as well as a high-frequency component resulting from the comparatively small displacements carried out by the first linear motor 69 in order to achieve the desired positioning accuracy. Since the force frame 41 is comparatively stiff and is placed on a solid base, the mechanical vibrations caused by the low-frequency component of the reaction force in the force frame 41 are negligibly small. The high-frequency component of the reaction force does have a small value, but it usually has a frequency which is comparable to a resonance frequency characteristic of a type of frame such as the force frame 41 used. As a result, the high-frequency component of the reaction force causes a non-negligible high-frequency mechanical vibration in the force frame 41. The force frame 41 is dynamically isolated from the machine frame 45, i.e. mechanical vibrations having a frequency above a certain threshold value, for example 10 Hz, present in the force frame 41 are not transmitted into the machine frame 45, because the latter is coupled to the force frame 41 exclusively via the low-frequency dynamic isolators 51. It is achieved thereby that the high-frequency mechanical vibrations caused in the force frame 41 by the reaction forces of the second positioning device 31 are not transmitted into the machine frame 45, similar to the floor vibrations mentioned above. Since the plane guides 65 of the support member 57 extend perpendicularly to the Z-direction, and the driving forces exerted by the second positioning device 31 on the mask holder 5 are also directed perpendicularly to the Z-direction, said driving forces themselves do not cause any mechanical vibrations in the machine frame 45 either. Furthermore, the mechanical vibrations present in the force frame 41 cannot be transmitted into the machine frame 45 through the stationary part 73 and the movable part 77 of the second linear motor 71 either because, as is apparent from the above, the mask holder 5 is coupled to the movable part 77 of the second linear motor 71 substantially exclusively by Lorentz forces of the magnet system and the electric coil system of the first linear motor 69, and the mask holder 5 is physically decoupled from the movable part 77 of the second linear motor 71, apart from said Lorentz forces. So the above discussion shows that the machine frame 45 remains substantially free from mechanical vibrations and deformations caused by the driving forces and reaction forces of the second positioning device 31. The advantages thereof will be further discussed below.

Figure 3:
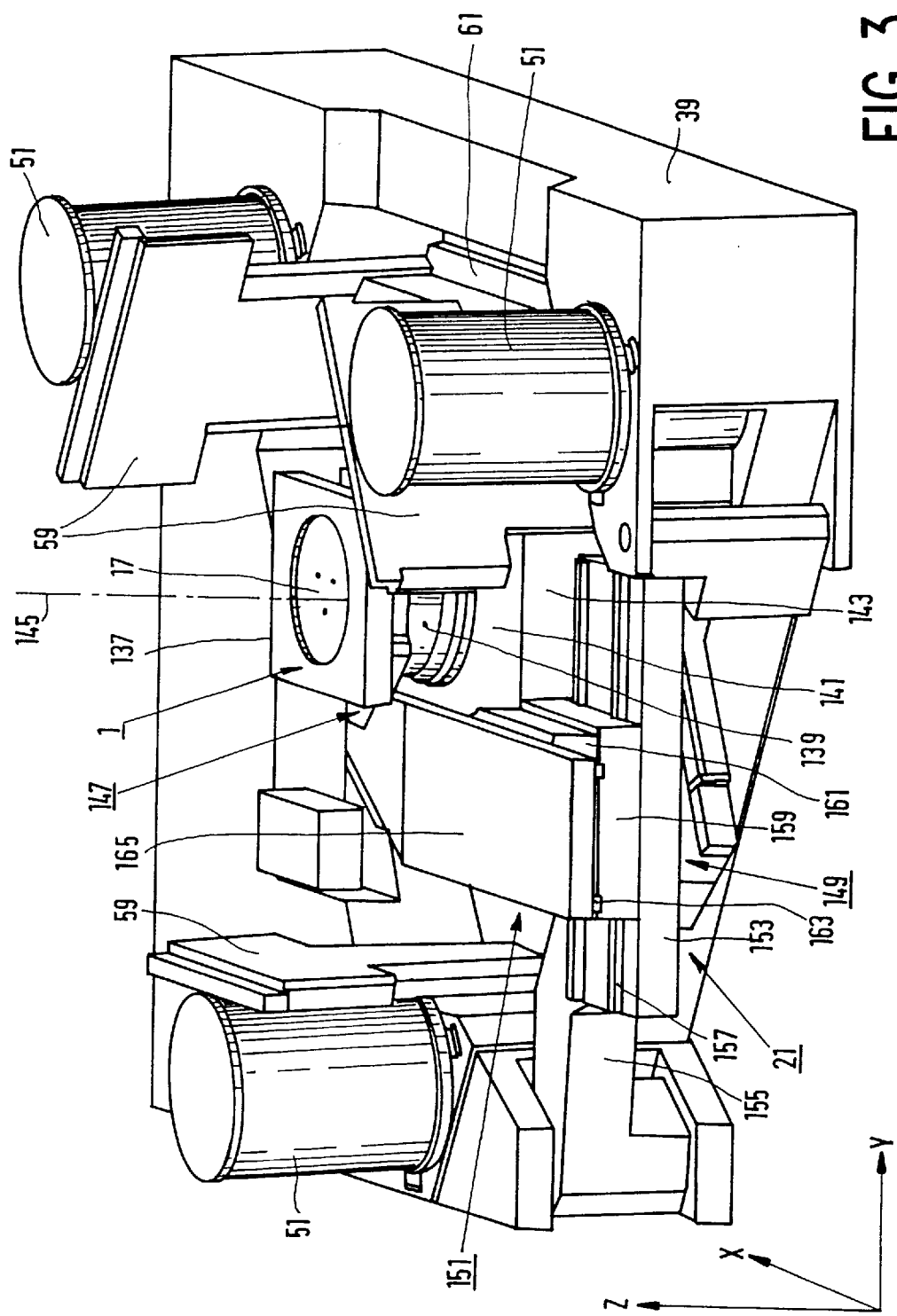
FIG. 3 shows a base and a substrate holder of the lithographic device of FIG. 1.
Figure 4:
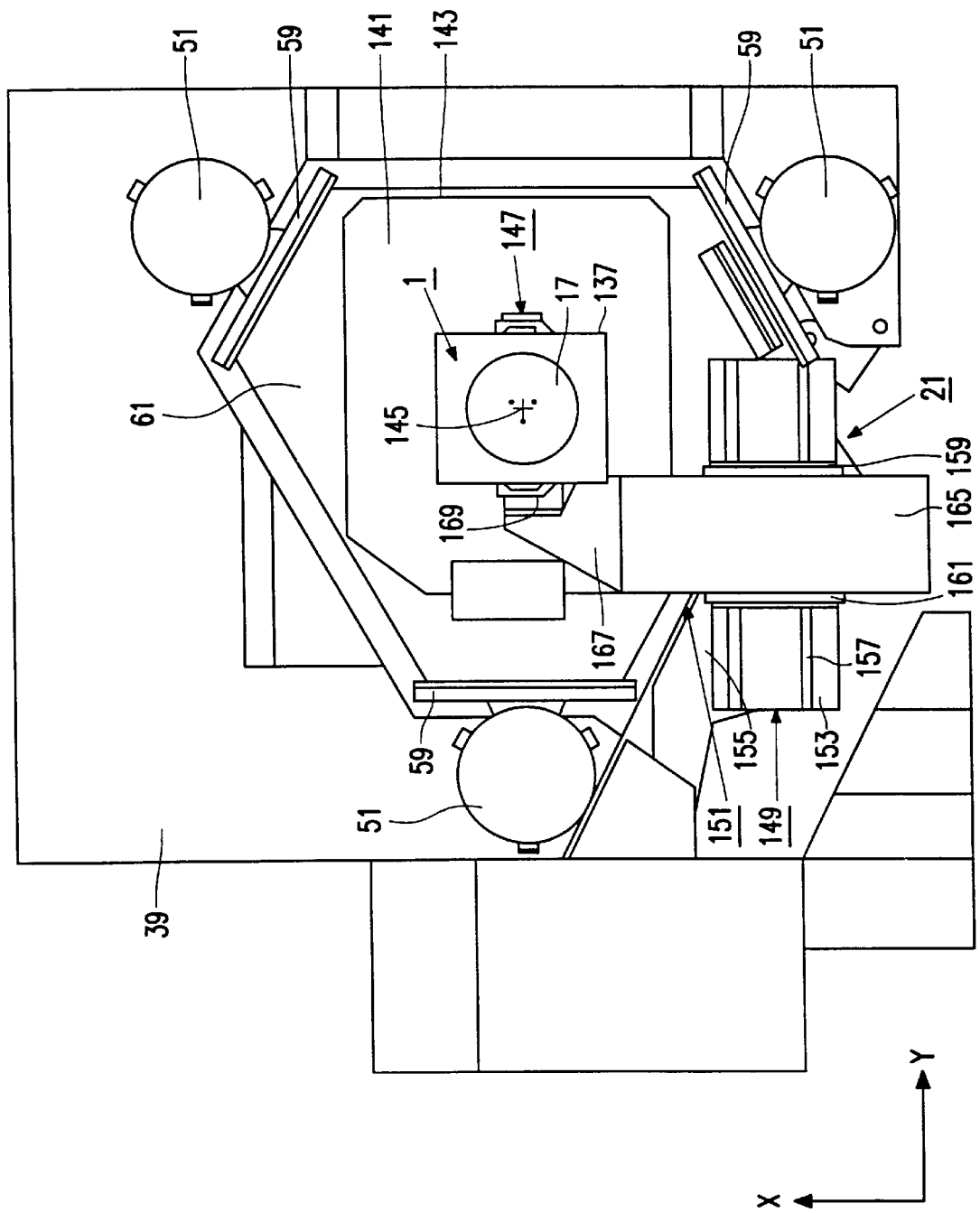
FIG. 4 is a plan view of the base and the substrate holder of the lithographic device of FIG. 3.

As FIGS. 3 and 4 show, the substrate holder 1 comprises a block 137 on which said support surface 17 is present, and an aerostatically supported foot 139 which is provided with an aerostatic bearing. The substrate holder 1 is guided over an upper surface 141, which extends perpendicularly to the Z-direction, of a granite support 143 provided on the support plate 61 of the machine frame 45 by means of the aerostatically supported foot 139, and has freedoms of displacement parallel to the X-direction and parallel to the Y-direction, and a freedom of rotation about an axis of rotation 145 of the substrate holder 1 which is directed parallel to the Z-direction.

As FIGS. 1, 3 and 4 further show, the positioning device 21 of the substrate holder 1 comprises a first linear motor 147, a second linear motor 149, and a third linear motor 151. The second linear motor 149 and the third linear motor 151 of the positioning device 21 are of a kind identical to the second linear motor 71 of the positioning device 31. The second linear motor 149 comprises a stationary part 153 fastened on an arm 155 which is fastened to the base 39 belonging to the force frame 41. The stationary part 153 comprises a guide 157 which extends parallel to the Y-direction and along which a movable part 159 of the second linear motor 149 is displaceable. A stationary part 161 of the third linear motor 151 is arranged on the movable part 159 of the second linear motor 149 and is provided with a guide 163 which extends parallel to the X-direction and along which a movable part 165 of the third linear motor 151 is displaceable. As is visible in FIG. 4, the movable part 165 of the third linear motor 151 comprises a coupling piece 167 to which an electric coil holder 169 of the first linear motor 147 is fastened. The first linear motor 147 of the first positioning device 21 is, as is the first linear motor 69 of the second positioning device 31, of a kind known from EP-B-0 421 527. Since the first linear motor 69 of the second positioning device 31 has been described above in detail, a detailed description of the first linear motor 147 of the first positioning device 21 is omitted here. It is sufficient to note that the substrate holder 1 is coupled to the movable part 165 of the third linear motor 151 exclusively by a Lorentz force perpendicular to the Z-direction during operation. A difference between the first linear motor 147 of the first positioning device 21 and the first linear motor 69 of the second positioning device 31 is, however, that the first linear motor 147 of the first positioning device 21 comprises X-motors and Y-motors of comparable power ratings, whereas the single Y-motor 123 of the first linear motor 69 of the second positioning device 31 has a power rating which is relatively low compared with power ratings of the X-motors 115, 117, 119, 121. This means that the substrate holder 1 can not only be taken along by the first linear motor 147 parallel to the X-direction over comparatively large distances, but also parallel to the Y-direction. Furthermore, the substrate holder 1 is rotatable about the axis of rotation 145 by means of the first linear motor 147.

During exposure of the semiconductor substrate 19, the substrate holder 1 should be displaced relative to the focusing system 3 parallel to the X-direction with a high positioning accuracy, while the substrate holder 1 is to be displaced parallel to the X-direction or the Y-direction when a next field 35 of the semiconductor substrate 19 is brought into position relative to the focusing system 3 for exposure. To displace the substrate holder 1 parallel to the X-direction, the coil holder 169 of the first linear motor 147 is displaced parallel to the X-direction by means of the third linear motor 151, a desired displacement of the substrate holder 1 being approximately achieved by the third linear motor 151, and the substrate holder 1 being taken along by a suitable Lorentz force of the first linear motor 147 relative to the movable part 165 of the third linear motor 151. In a similar manner, a desired displacement of the substrate holder 1 parallel to the Y-direction is approximated in that the coil holder 169 is displaced parallel to the Y-direction by means of the second linear motor 149, the substrate holder 1 being taken along by a suitable Lorentz force of the first linear motor 147 relative to the movable part 165 of the third linear motor 151. Said desired displacement of the substrate holder 1 parallel to the X-direction or Y-direction is achieved by means of the Lorentz force of the first linear motor 147 which is controlled during the displacement of the substrate holder 1 by means of the position control system of the lithographic device referred to above, with which a positioning accuracy in the sub-micron or even nanometer range is achieved. Since the desired displacement of the substrate holder 1 need be achieved by approximation only by the second linear motor 149 and the third linear motor 151, and accordingly no particularly high requirements are imposed on the positioning accuracy of the second and third linear motors 149, 151, the second linear motor 149 and the third linear motor 151 are, as is the second linear motor 71 of the second positioning device 31, comparatively simple, conventional, one-dimensional linear motors by means of which the substrate holder 1 is displaceable with a comparatively low accuracy over comparatively large distances parallel to the Y-direction and X-direction, respectively. The desired accuracy of the displacement of the substrate holder 1 is achieved in that the substrate holder 1 is displaced by the first linear motor 147 over comparatively small distances relative to the movable part 165 of the third linear motor 151.

Since the positioning device 21 of the substrate holder 1 is of a kind similar to the positioning device 31 of the mask holder 5, and the stationary part 153 of the second linear motor 149 of the first positioning device 21 is fastened to the force frame 41 of the lithographic device, as is the stationary part 73 of the second linear motor 71 of the second positioning device 31, it is achieved that a reaction force exerted by the substrate holder 1 on the first positioning device 21 during operation and arising from a driving force exerted by the first positioning device 21 on the substrate holder 1 is exclusively transmitted into the force frame 41. This achieves that the reaction forces of the first positioning device 21 as well as the reaction forces of the second positioning device 31 cause mechanical vibrations in the force frame 41, which are not transmitted into the machine frame 45. Since the upper surface 141 of the granite support 143 over which the substrate holder 1 is guided extends perpendicularly to the Z-direction, furthermore, the driving forces of the first positioning device 21, which are also perpendicular to the Z-direction, themselves do not cause any mechanical vibrations in the machine frame 45 either.

The pattern present on the mask 29 is imaged on the semiconductor substrate 19 with said accuracy because the mask 29 and the semiconductor substrate 19 are both displaceable with said accuracy relative to the focusing system 3 parallel to the X-direction by means of the second positioning device 31 and the first positioning device 21, respectively, during the exposure of the semiconductor substrate 19, and because the mask 29 and the semiconductor substrate 19 can in addition be positioned parallel to the Y-direction and be rotated about the respective axes of rotation 67, 145 with said accuracy. The accuracy with which said pattern is imaged on the semiconductor substrate 19 is even better than the positioning accuracy of the positioning device 21, 31 because the mask holder 5 is not only displaceable parallel to the X-direction, but is also displaceable parallel to the Y-direction and rotatable about the axis of rotation 67. A displacement of the mask 29 relative to the focusing system 3 in fact results in a shift of the pattern image on the semiconductor substrate 19 which is equal to a quotient of said displacement of the mask 29 and the optical reduction factor of the focusing system 3. The pattern of the mask 29 can thus be imaged on the semiconductor substrate 19 with an accuracy which is equal to a quotient of the positioning accuracy of the second positioning device 31 and the reduction factor of the focusing system 3.

Figure 7:
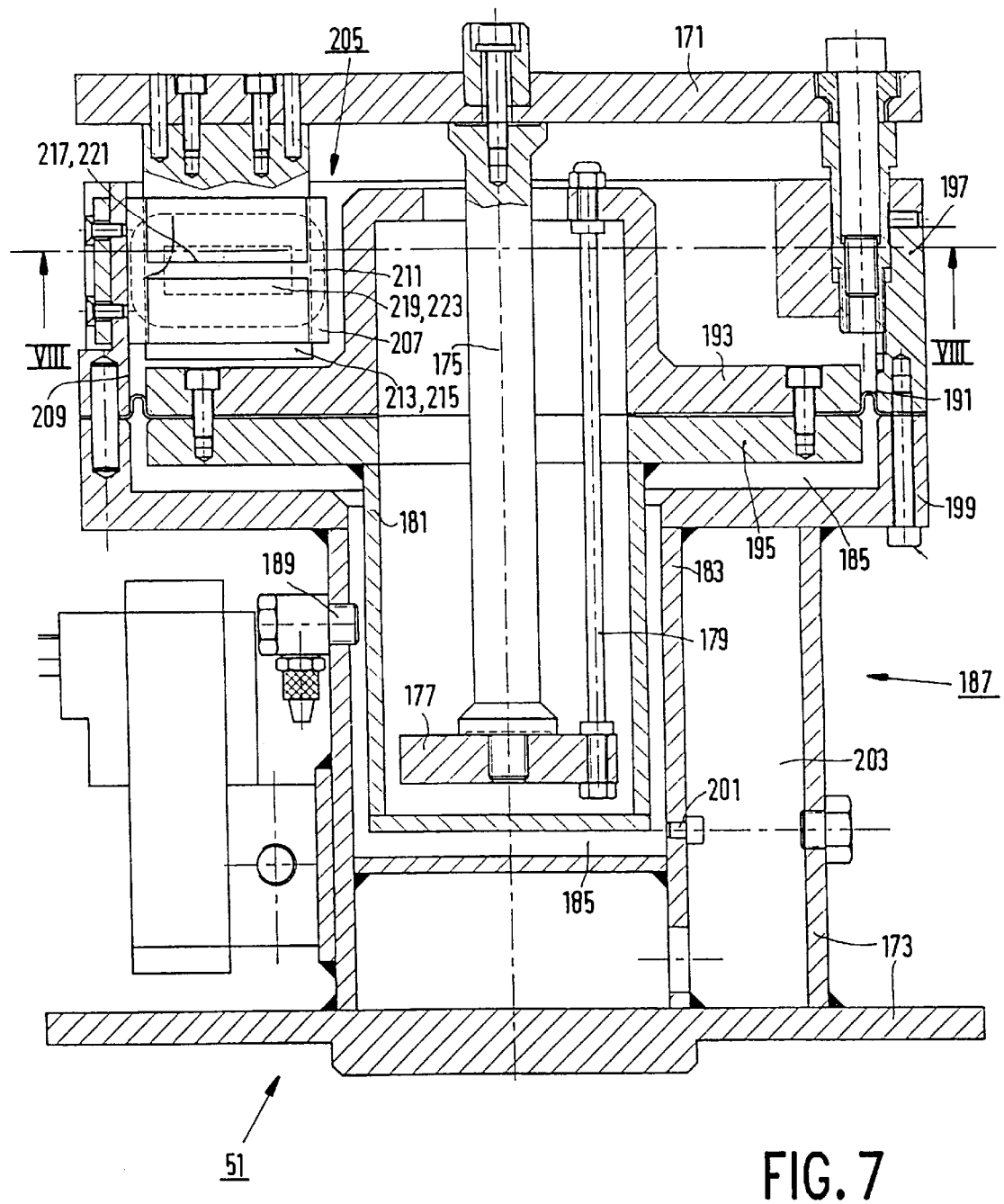
FIG. 7 is a cross-section of a dynamic isolator of the lithographic device of FIG. 1.
Figure 8:
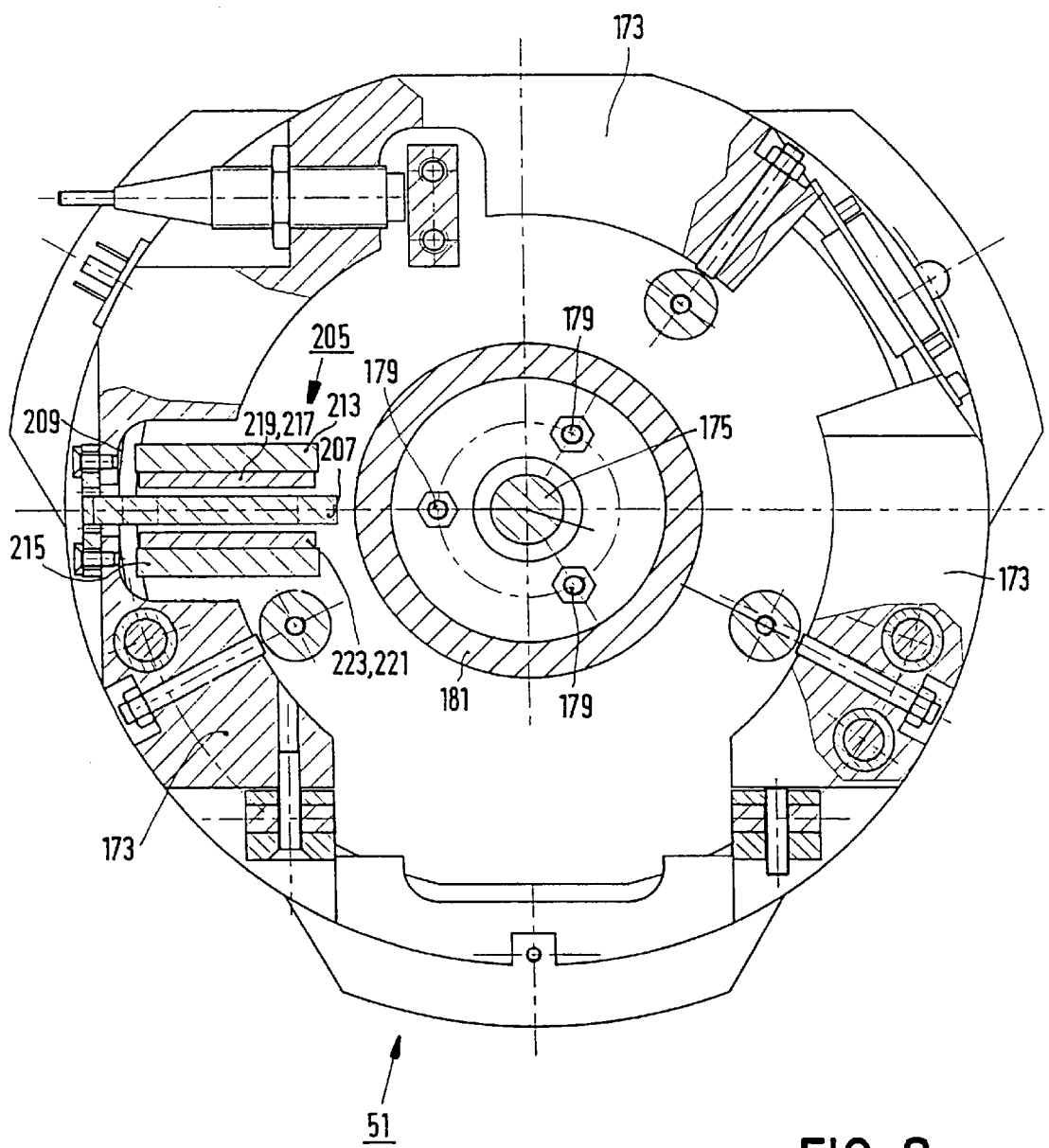
FIG. 8 is a cross-section taken on the line VIII—VIII in FIG. 7, and FIG. 9 diagrammatically shows a force actuator system of the lithographic device of FIG. 1.

FIGS. 7 and 8 show one of the three dynamic isolators 51 in cross-section. The dynamic isolator 51 shown comprises a mounting plate 171 to which the corner portion 49 of the main plate 47 of the machine frame 45 resting on the dynamic isolator 51 is fastened. The dynamic isolator 51 further comprises a housing 173 which is fastened on the base 39 of the force frame 41. The mounting plate 171 is connected via a coupling rod 175 directed parallel to the Z-direction to an intermediate plate 177 which is suspended in a cylindrical tub 181 by means of three parallel tension rods 179. Only one tension rod 179 is visible in FIG. 7, while all three tension rods 179 are visible in FIG. 8. The cylindrical tub 181 is positioned concentrically in a cylindrical chamber 183 of the housing 173. A space 185 present between the cylindrical tub 181 and the cylindrical chamber 183 forms part of a pneumatic spring 187 and is filled with compressed air through a feed valve 189. The space 185 is sealed by means of an annular, flexible rubber membrane 191 which is fastened between a first part 193 and a second part 195 of the cylindrical tub 181 and between a first part 197 and a second part 199 of the housing 173. The machine frame 45 and the components of the lithographic device supported by the machine frame 45 are thus supported in a direction parallel to the Z-direction by the compressed air in the spaces 185 of the three dynamic isolators 51, the cylindrical tub 181 and accordingly also the machine frame 45 having a certain freedom of movement relative to the cylindrical chamber 183 as a result of the flexibility of the membrane 191. The pneumatic spring 187 has a stiffness such that a mass spring system formed by the pneumatic springs 187 of the three dynamic isolators 51 and by the machine frame 45 and the components of the lithographic device supported by the machine frame 45 has a comparatively low resonance frequency such as, for example, 3 Hz. The machine frame 45 is dynamically isolated thereby from the force frame 41 as regards mechanical vibrations having a frequency above a certain threshold value such as, for example, the 10 Hz mentioned earlier. As FIG. 7 shows, the space 185 is connected to a side chamber 203 of the pneumatic spring 187 via a narrow passage 201. The narrow passage 201 acts as a damper by means of which periodic movements of the cylindrical tub 181 relative to the cylindrical chamber 183 are damped.

As FIGS. 7 and 8 further show, each dynamic isolator 51 comprises a force actuator 205 which is integrated with the dynamic isolator 51. The force actuator 205 comprises an electric coil holder 207 which is fastened to an inner wall 209 of the housing 173. As FIG. 7 shows, the coil holder 207 comprises an electric coil 211 which extends perpendicularly to the Z-direction and is indicated in the Figure with a broken line. The coil holder 207 is arranged between two magnetic yokes 213 and 215 which are fastened to the mounting plate 171. Furthermore, a pair of permanent magnets (217, 219), (221, 223) is fastened to each yoke 213, 215, the magnets (217, 219), (221, 223) of a pair being magnetized in opposite directions each time perpendicular to the plane of the electric coil 211. When an electric current is passed through the coil 211, the coil 211 and the magnets (217, 219, 221, 223) mutually exert a Lorentz force directed parallel to the Z-direction. The value of said Lorentz force is controlled by an electric controller of the lithographic device (not shown) in a manner which will be explained in more detail further below.

Figure 9:
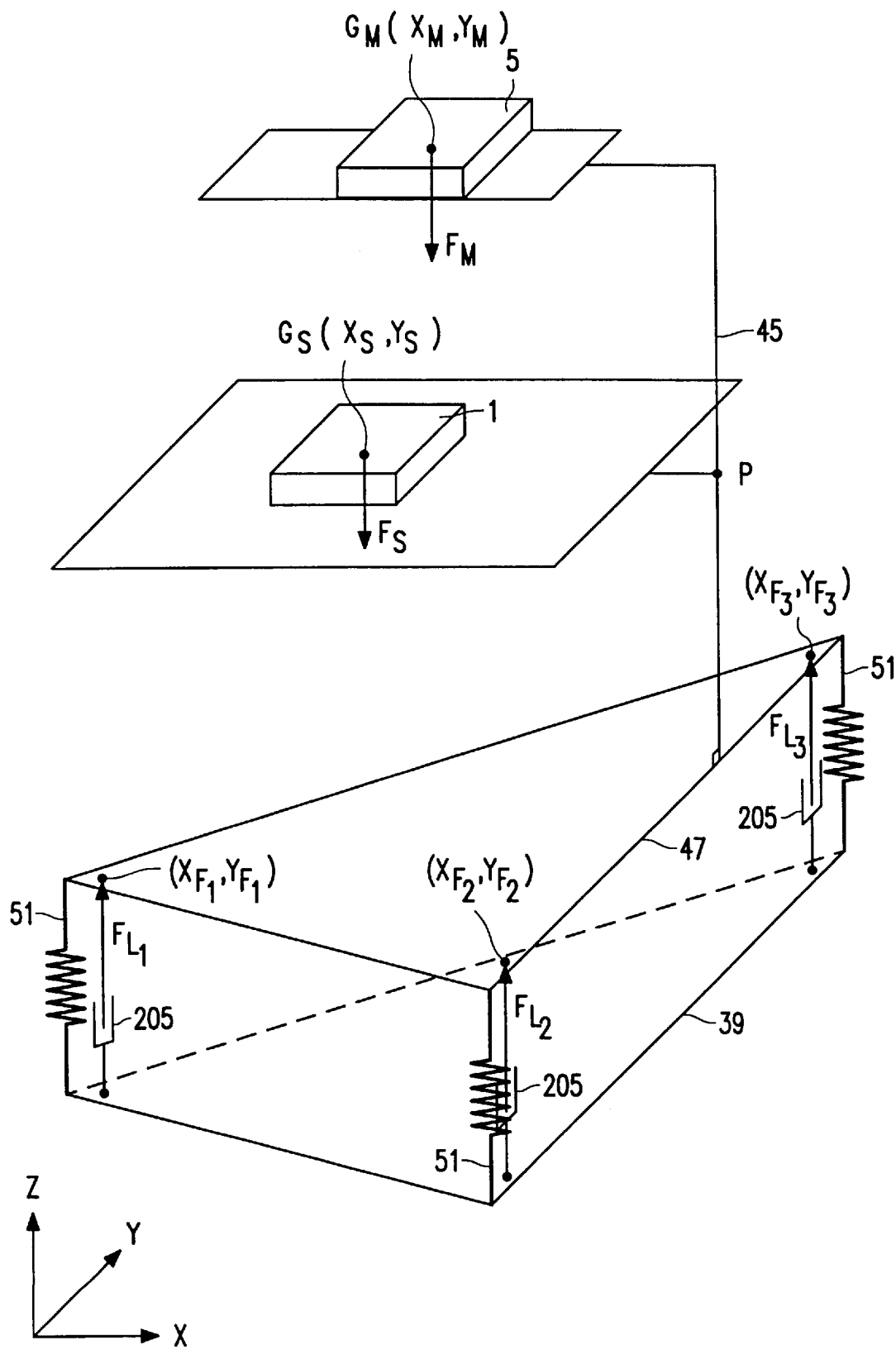

The force actuators 205 integrated with the dynamic isolators 51 form a force actuator system which is diagrammatically pictured in FIG. 9. FIG. 9 further diagrammatically shows the machine frame 45 and the substrate holder 1 and mask holder 5 which are displaceable relative to the machine frame 45, as well as the base 39 and the three dynamic isolators 51. FIG. 9 further shows a reference point P of the machine frame 45 relative to which a centre of gravity $G_S$ of the substrate holder 1 has an X-position $X_S$ and a Y-position $Y_S$, and a centre of gravity $G_M$ of the mask holder 5 has an X-position $X_M$ and a Y-position $Y_M$. It is noted that said centres of gravity $G_S$ and $G_M$ denote the centre of gravity of the total displaceable mass of the substrate holder 1 with the semiconductor substrate 19 and that of the mask holder 5 with the mask 29, respectively. As FIG. 9 further shows, the Lorentz forces $F_{L,1}$, $F_{L,2}$ and $F_{L,3}$ of the three force actuators 205 have points of application on the machine frame 45 with an X-position $X_{F,1}$, $X_{F,2}$ and $X_{F,3}$ and a Y-position $Y_{F,1}$, $Y_{F,2}$ and $Y_{F,3}$ relative to the reference point P. Since the machine frame 45 support the substrate holder 1 and the mask holder 5 parallel to the vertical Z-direction, the substrate holder 1 and the mask holder 5 exert a support force $F_S$ and a support force $F_M$, respectively, on the machine frame 45 having a value corresponding to a value of a force of gravity acting on the substrate holder 1 and the mask holder 5. The support forces $F_S$ and $F_M$ have points of application relative to the machine frame 45 with an X-position and Y-position corresponding to the X-position and Y-position of the centres of gravity $G_S$ and $G_M$ of the substrate holder 1 and the mask holder 5, respectively. If the substrate holder 1 and the mask holder 5 are displaced relative to the machine frame 45 during exposure of the semiconductor substrate 19, the points of application of the support forces $F_S$ and $F_M$ of the substrate holder 1 and the mask holder 5 are also displaced relative to the machine frame 45. Said electric controller of the lithographic device controls the value of the Lorentz forces $F_{L,1}$, $F_{L,2}$ and $F_{L,3}$ such that a sum of mechanical moments of the Lorentz forces $F_{L,1}$, $F_{L,2}$ and $F_{L,3}$ about the reference point P of the machine frame 45 has a value which is equal to and a direction which is opposed to a value and a direction, respectively, of a sum of mechanical moments of the support forces $F_S$ and $F_M$ of the substrate holder 1 and the mask holder 5 about the reference point P:

$$F_{L,1}+F_{L,2}+F_{L,3}=F_S+F_M$$

$$F_{L,1}*X_{F,1}+F_{L,2}*X_{F,2}+F_{L,3}*X_{F,3}=F_S*X_S+F_M*X_M$$

$$F_{L,1}*Y_{F,1}+F_{L,2}*Y_{F,2}+F_{L,3}*Y_{F,3}=F_S*Y_S+F_M*Y_M$$

The controller which controls the Lorentz forces $F_{L,1}$, $F_{L,2}$ and $F_{L,3}$ comprises, for example, a feedforward control loop which is usual and known per se, where the controller receives information on the positions $X_S$, $Y_S$ of the substrate holder 1 and the positions $X_M$, $Y_M$ of the mask holder 5 from an electric control unit (not shown) of the lithographic device which controls the substrate holder 1 and the mask holder 5, the received information relating to the desired positions of the substrate holder 1 and the mask holder 5. The controller may alternatively be provided with a feedback control loop which is usual and known per se, where the controller receives information on the positions $X_S$, $Y_S$ of the substrate holder 1 and the positions $X_M$, $Y_M$ of the mask holder 5 from said position control system of the lithographic device, the received information relating to the measured positions of the substrate holder 1 and the mask holder 5. The controller may alternatively comprise a combination of said feedforward and feedback control loops. The Lorentz forces $F_{L,1}$, $F_{L,2}$ and $F_{L,3}$ of the force actuator system thus form a compensation force by means of which displacements of the centres of gravity $G_S$ and $G_M$ of the substrate holder 1 and the mask holder 5 relative to the machine frame 45 are compensated. Since the sum of the mechanical moments of the Lorentz forces $F_{L,1}$, $F_{L,2}$, $F_{L,3}$ and the support forces $F_S$, $F_M$ about the reference point P of the machine frame 45 has a constant value and direction, the substrate holder 1 and the mask holder 5 each have a so-called virtual centre of gravity which has a substantially constant position relative to the machine frame 45. It is achieved thereby that the machine frame 45 does not sense the displacements of the actual centres of gravity $G_S$ and $G_M$ of the substrate holder 1 and the mask holder 5 during exposure of the semiconductor substrate 19. Without the above force actuator system, a displacement of the substrate holder 1 or the mask holder 5 would lead to an uncompensated change in the mechanical moment of the support forces $F_S$ or $F_M$ about the reference point P, as a result of which the machine frame 45 would perform a low-frequency shaking movement on the dynamic isolators 51, or elastic deformations or mechanical vibrations could arise in the machine frame 45.

The fact that the three force actuators 205 are integrated with the three dynamic isolators 51 results in a compact and simple construction of the force actuator system and the lithographic device. The triangular arrangement of the dynamic isolators 51 in addition achieves a particularly stable operation of the force actuator system. Since the compensation force of the force actuator system comprises exclusively a Lorentz force, mechanical vibrations present in the base 39 and the force frame 41 are not transmitted to the machine frame 45 through the force actuators 205.

The measures discussed above, i.e. the direct introduction of the reaction forces of the positioning devices 21, 31 exclusively into the force frame 41, the direct coupling of the substrate holder 1 and the mask holder 5 to the force frame 41 exclusively by means of a Lorentz force, and the compensation force of the force actuators 205 have the result that the machine frame 45 has a supporting function only. Substantially no forces act on the machine frame 45 which change in value or direction. An exception is formed by, for example, the horizontal viscous frictional forces exerted by the aerostatic bearings of the substrate holder 1 and the mask holder 5 on the upper surface 141 of the granite support 143 and the plane guides 65 of the support member 57, respectively, during displacements of the substrate holder 1 and the mask holder 5. Such frictional forces, however, are comparatively small and do not result in appreciable vibrations or deformations of the machine frame 45. Since the machine frame 45 remains free from mechanical vibrations and elastic deformations, the components of the lithographic device supported by the machine frame 45 occupy particularly accurately defined positions relative to one another. In particular the facts that the position of the substrate holder 1 relative to the focusing system 3 and the position of the mask holder 5 relative to the focusing system 3 are very accurately defined, and in addition that the substrate holder 1 and the mask holder 5 can be very accurately positioned relative to the focusing system 3 by means of the positioning devices 21, 31, imply that the pattern of a semiconductor circuit present on the mask 29 can be imaged on the semiconductor substrate 19 with an accuracy which lies in the sub-micron range. Since the machine frame 45 and the focusing system 3 remain free from mechanical vibrations and elastic deformations, moreover, the advantage is created that the machine frame 45 can act as a reference frame for the position control system mentioned above of the substrate holder 1 and the mask holder 5, where position sensors of said position control system such as, for example, optical elements and systems of said laser interferometer, can be mounted directly to the machine frame 45. Mounting of said position sensors directly to the machine frame 45 results in that the position occupied by said position sensors relative to the substrate holder 1, the focusing system 3, and the mask holder 5 is not influenced by mechanical vibrations and deformations, so that a particularly reliable and accurate measurement of the positions of the substrate holder 1 and the mask holder 5 relative to the focusing system 3 is obtained. Since also the mask holder 5 can not only be positioned parallel to the X-direction, but can also be positioned parallel to the Y-direction and rotated about the axis of rotation 67, whereby a particularly high accuracy of imaging the pattern of the mask 29 on the semiconductor substrate 19 is achieved, as noted above, semiconductor substrates with detail dimensions in the sub-micron range can be manufactured by means of the lithographic device according to the invention.

A lithographic device according to the invention was described above with a substrate holder 1 which is displaceable by means of a first positioning device 21 according to the invention, and a mask holder 5 which is displaceable by means of a second positioning device 31 according to the invention. The positioning devices 21, 31 have a common first frame, i.e. the machine frame 45 of the lithographic device, and a common second frame, i.e. the force frame 41 of the lithographic device. It is noted that the positioning devices 21, 31 may alternatively each have a first and second frame of their own, a common first frame and each a second frame of their own, or a common second frame and each a first frame of their own.

It is further noted that the invention also covers lithographic devices which work by the "step and repeat" principle mentioned earlier. Thus, for example, a positioning device according to the invention can be used for the displacement of the substrate holder in the lithographic device which is known from EP-A-0 498 496 and in which exclusively the substrate holder is displaceable over comparatively large distances relative to the focusing system. Such a lithographic device covered by the invention is also obtained in that the second positioning device 31 with mask holder 5 is replaced in the lithographic device discussed in the description of the Figures by a conventional mask holder which is stationary relative to the machine frame 45, such as the one known, for example, from EP-A-0 498 496. The invention also covers lithographic devices which work by the "step and scan" principle mentioned above where the mask holder only is driven by a positioning device according to the invention, and the substrate holder is driven by a conventional positioning device such as the one known from, for example, EP-A-0 498 496. Such a construction is conceivable, for example, if the focusing system of the lithographic device has a comparatively great optical reduction factor, so that the displacements of the substrate holder are comparatively small in relation to the displacements of the mask holder, and the positioning device of the substrate holder causes comparatively small mechanical vibrations in the machine frame.

The lithographic device described above comprises a force actuator system which is common to the first positioning device 21 and the second positioning device 31 and which supplies a compensation force by which displacements of the centres of gravity of both the substrate holder 1 and the mask holder 5 can be compensated. It is noted that a lithographic device according to the invention may alternatively be provided with two force actuator systems with which the displacements of the centres of gravity of the substrate holder 1 and the mask holder 5 can be individually compensated. A lithographic device according to the invention may also comprise a single force actuator system with which exclusively displacements of the centre of gravity of the mask holder can be compensated. Such a construction is conceivable, for example, if the focusing system of the lithographic device has a comparatively great optical reduction factor, so that the displacements of the centre of gravity of the substrate holder are comparatively small relative to the displacements of the centre of gravity of the mask holder, and the displacements of the centre of gravity of the substrate holder cause comparatively small mechanical vibrations in the machine frame.

The lithographic device according to the invention as described above is used for exposing semiconductor substrates in the manufacture of integrated electronic semiconductor circuits. It is further noted that such a lithographic device may alternatively be used for the manufacture of other products having structures with detail dimensions in the sub-micron range, where mask patterns are imaged on a substrate by means of the lithographic device. Structures of integrated optical systems or conduction and detection patterns of magnetic domain memories, as well as structures of liquid crystal display patterns may be mentioned in this connection.

It is further noted that a positioning device according to the invention may be used not only in a lithographic device but also in other devices in which objects or substrates are to be positioned in an accurate manner. Examples are devices for analyzing or measuring objects or materials, where an object or material is to be positioned or displaced accurately relative to a measuring system or scanning system. Another application for a positioning device according to the invention is, for example, a precision machine tool by means of which workpieces, for example lenses, can be machined with accuracies in the sub-micron range. The positioning device according to the invention is used in this case for positioning the workpiece relative to a rotating tool, or for positioning a tool relative to a rotating workpiece.

The first positioning device 21 of the lithographic device described comprises a drive unit with a first linear motor which supplies exclusively a Lorentz force, and a conventional second and third linear motor, while the second positioning device 31 of the lithographic device described comprises a drive unit with a first linear motor supplying exclusively a Lorentz force, and a single conventional second linear motor. It is finally noted that the invention also relates to positioning devices provided with different drive units. Examples are a positioning device which comprises only a single motor supplying exclusively a Lorentz force, with a magnet system of the motor fastened to the object table supported by the first frame and an electric coil system of the motor fastened to the second frame, and a positioning device which comprises only a single conventional motor, with a stationary part of the motor fastened to the second frame and a movable part of the motor fastened to the object table supported by the first frame.

We claim:

1. A positioning device with an object table and a drive unit by which the object table is displaceable over a guide parallel to at least an X-direction, which guide is fastened to a first frame of the positioning device while a stationary part of the drive unit is fastened to a second frame of the positioning device which is dynamically isolated from the first frame, wherein a reaction force exerted by the object table on the drive unit during operation and arising from a driving force exerted by the drive unit on the object table is transmittable exclusively into the second frame.

2. A positioning device as claimed in claim 1, wherein the object table is coupled to the stationary part of the drive unit exclusively by a Lorentz force of a magnet system and an electric coil system of the drive unit during operation.

3. A positioning device as claimed in claim 2, wherein the magnet system and the electric coil system belong to a first linear motor of the drive unit, which drive unit comprises a second linear motor with a stationary part fastened to the second frame and a movable part which is displaceable parallel to the X-direction over a guide of the stationary part, the magnet system of the first linear motor being fastened to the object table and the electric coil system of the first linear motor being fastened to the movable part of the second linear motor.

4. A positioning device as claimed in claim 3, wherein the drive unit comprises a third linear motor with a stationary part which is fastened to the movable part of the second linear motor, and with a movable part which is displaceable parallel to a Y-direction which is perpendicular to the X-direction over a guide of the stationary part of the third linear motor, the electric coil system of the first linear motor being fastened to the movable part of the third linear motor.

5. A positioning device as claimed in claim 1, wherein the positioning device is provided with a force actuator system controlled by an electric control unit and exerting a compensation force on the first frame during operation, which compensation force has a mechanical moment about a reference point of the first frame having a value equal to a value of a mechanical moment of a force of gravity acting on the object table about said reference point and a direction which is opposed to a direction of the mechanical moment of said force of gravity.

6. A positioning device as claimed in claim 5, wherein object table is displaceable parallel to a horizontal direction, while the force actuator system exerts the compensation force on the first frame parallel to a vertical direction.

7. A positioning device as claimed in claim 6, wherein the object table is displaceable parallel to a horizontal X-direction and parallel to a horizontal Y-direction which is perpendicular to the X-direction, while the force actuator system comprises three force actuators mutually arranged in a triangle and each exerting a compensation force on the first frame parallel to the vertical direction.

8. A positioning device as claimed in claim 5, wherein the force actuator system is integrated with a system of dynamic isolators by means of which the first frame is coupled to a base of the positioning device.

9. A positioning device as claimed in claim 5, wherein the compensation force comprises exclusively a Lorentz force of a magnet system and an electric coil system of the force actuator system.

10. A lithographic device with a machine frame which, seen parallel to a vertical Z-direction, supports in that order a radiation source, a mask holder, a focusing system with a main axis directed parallel to the Z-direction, and a substrate holder which is displaceable perpendicularly to the Z-direction by means of a positioning device, the positioning device of the substrate holder, including an object table and a drive unit by which the object table is displaceable over a guide parallel to at least an X-direction, which guide is fastened to a first frame of the positioning device while a stationary part of the drive unit is fastened to a second frame of the positioning device which is dynamically isolated from the first frame, wherein the first frame of the positioning device of the substrate holder belongs to the machine frame of the lithographic device, while the second frame of the positioning device of the substrate holder belongs to a force frame of the lithographic device which is dynamically isolated from the machine frame; and wherein a reaction force exerted by the object table on the drive unit during operation and arising from a driving force exerted by the drive unit on the object table is transmittable exclusively into the second frame.

11. A lithographic device with a machine frame which, seen parallel to a vertical Z-direction, supports in that order a radiation source, a mask holder which is displaceable perpendicularly to the Z-direction by means of a positioning device, a focusing system with a main axis directed parallel to the Z-direction, and a substrate holder which is displaceable perpendicularly to the Z-direction by means of a further positioning device, the positioning device of the mask holder including an object table and a drive unit by which the object table is displaceable over a guide parallel to at least an X-direction, which guide is fastened to a first frame of the positioning device while a stationary part of the drive unit is fastened to a second frame of the positioning device which is dynamically isolated from the first frame, wherein the first frame of the positioning device of the mask holder belongs to the machine frame of the lithographic device, while the second frame of the positioning device of the mask holder belongs to a force frame of the lithographic device which is dynamically isolated from the machine frame; and wherein a reaction force exerted by the object table on the drive unit during operation and arising from a driving force exerted by the drive unit on the object table is transmittable exclusively into the second frame.

12. A lithographic device as claimed in claim 10, wherein the mask holder is displaceable perpendicularly to the Z-direction by means of said positioning device as claimed in wherein the first frame of the positioning device of the mask holder belongs to the machine frame of the lithographic device, while the second frame of the positioning device of the mask holder belongs to the force frame of the lithographic device.

13. A lithographic device as claimed in claim 11, wherein the positioning devices of the substrate holder and the mask holder have a joint force actuator system which is controlled by an electric control unit and which exerts a compensation force on the machine frame of the lithographic device during operation which has a mechanical moment about a reference point of the machine frame of a value which is equal to a value of a sum of a mechanical moment of a force of gravity acting on the substrate holder about said reference point and a mechanical moment of a force of gravity acting on the mask holder about said reference point, and a direction which is opposed to a direction of said sum of mechanical moments.

14. A lithographic device as claimed in claim 13, wherein the machine frame is placed on a base of the lithographic device, on which also the force frame is placed, by means of three dynamic isolators mutually arranged in a triangle, while the joint force actuator system comprises three separate force actuators which are each integrated with a corresponding one of the dynamic isolators.

15. A positioning device as claimed in claim 2, wherein the positioning device is provided with a force actuator system controlled by an electric control unit and exerting a compensation force on the first frame during operation, which compensation force has a mechanical moment about a reference point of the first frame having a value equal to a value of a mechanical moment of a force of gravity acting on the object table about said reference point and a direction which is opposed to a direction of the mechanical moment of said force of gravity.

16. A positioning device as claimed in claim 3, wherein the positioning device is provided with a force actuator system controlled by an electric control unit and exerting a compensation force on the first frame during operation, which compensation force has a mechanical moment about a reference point of the first frame having a value equal to a value of a mechanical moment of a force of gravity acting on the object table about said reference point and a direction which is opposed to a direction of the mechanical moment of said force of gravity.

17. A positioning device as claimed in claim 4, wherein the positioning device is provided with a force actuator system controlled by an electric control unit and exerting a compensation force on the first frame during operation, which compensation force has a mechanical moment about a reference point of the first frame having a value equal to a value of a mechanical moment of a force of gravity acting on the object table about said reference point and a direction which is opposed to a direction of the mechanical moment of said force of gravity.

18. A positioning device as claimed in claim 6, wherein the force actuator system is integrated with a system of dynamic isolators by means of which the first frame is coupled to a base of the positioning device.

19. A positioning device as claimed in claim 7, wherein the force actuator system is integrated with a system of dynamic isolators by means of which the first frame is coupled to a base of the positioning device.

20. A positioning device as claimed in claim 6, wherein the compensation force comprises exclusively a Lorentz force of a magnet system and an electric coil system of the force actuator system.

21. A positioning device as claimed in claim 7, wherein the compensation force comprises exclusively a Lorentz force of a magnet system and an electric coil system of the force actuator system.

22. A positioning device as claimed in claim 8, wherein the compensation force comprises exclusively a Lorentz force of a magnet system and an electric coil system of the force actuator system.

* * * * *

UNITED STATES PATENT AND TRADEMARK OFFICE
CERTIFICATE OF CORRECTION

PATENT NO. : 5,844,666  
APPLICATION NO. : 08/642014  
DATED : December 1, 1998  
INVENTOR(S) : Gerard van Engelen et al.

Page 1 of 1

It is certified that error appears in the above-identified patent and that said Letters Patent is hereby corrected as shown below:

Column 22, lines 47-48 (Claim 12, lines 3-4): delete the phrase "as claimed in".

Signed and Sealed this

Seventh Day of July, 2009

JOHN DOLL  
*Acting Director of the United States Patent and Trademark Office*